(12) United States Patent
Ishihara et al.

(10) Patent No.: US 6,627,986 B2
(45) Date of Patent: Sep. 30, 2003

(54) SUBSTRATE FOR SEMICONDUCTOR DEVICE AND SEMICONDUCTOR DEVICE FABRICATION USING THE SAME

(75) Inventors: Kaoru Ishihara, Yamaguchi (JP); Hiromichi Sakota, Yamaguchi (JP)

(73) Assignee: NEC Electronics Corporation, Kanagawa (JP)

( * ) Notice: Subject to any disclaimer, the term of this patent is extended or adjusted under 35 U.S.C. 154(b) by 20 days.

(21) Appl. No.: 09/809,083

(22) Filed: Mar. 16, 2001

(65) Prior Publication Data

US 2001/0022391 A1 Sep. 20, 2001

(30) Foreign Application Priority Data

Mar. 17, 2000 (JP) ........................................ 2000-081684

(51) Int. Cl.[7] .............................................. H01L 23/48
(52) U.S. Cl. ...................................... 257/690; 257/678
(58) Field of Search ................................ 257/666, 668, 257/673, 676, 678, 687, 690, 692, 693, 694, 695, 696, 697, 698, 700, 734, 735, 736, 737, 738, 707, 706, 701, 702, 703

(56) References Cited

U.S. PATENT DOCUMENTS

| | | | |
|---|---|---|---|
| 3,777,221 | * | 12/1973 | Tatusko et al. |
| 4,996,626 | * | 2/1991 | Say |
| 5,019,888 | * | 5/1991 | Scott et al. |
| 6,469,258 | | 10/2002 | Lee et al. |
| 2002/0125043 A1 | | 9/2002 | Yoshida |

FOREIGN PATENT DOCUMENTS

| | | |
|---|---|---|
| JP | 58-11252 | 1/1983 |
| JP | 8-148770 | 6/1996 |
| JP | 10-74800 | 3/1998 |
| JP | 10-189817 | 7/1998 |
| JP | 11-340592 | 12/1999 |
| KR | 1999-0039245 | 6/1999 |
| KR | 2001-77239 | 3/2001 |
| KR | 2001-156218 | 6/2001 |

* cited by examiner

*Primary Examiner*—Nathan J. Flynn
*Assistant Examiner*—Kevin Quinto
(74) *Attorney, Agent, or Firm*—Foley & Lardner

(57) ABSTRACT

A substrate for a semiconductor device is provided, which prevents a semiconductor element or IC chip mounted thereon from being broken or damaged electrostatically in a fabrication process sequence or a semiconductor device. The substrate comprises (a) a dielectric core material with an upper surface and a lower surface; the core having a mounting area on the upper surface, a semiconductor element being mounted in the mounting area; the core having a contact area, (b) inner terminals formed on the core material; the inner terminals being used for electrical connection to the semiconductor element mounted on the core material; (c) external terminals formed on the core material; the external terminals being used for electrical connection to an external circuit provided outside the substrate; and (d) inner wiring lines formed on the core material; the inner wiring lines connecting electrically and mechanically the inner terminals with the respective external terminals; part of the inner wiring lines being located in the contact area of the core in such a way as to be able to contact an external conductor provided outside the substrate.

16 Claims, 11 Drawing Sheets

SUBSTRATE FOR SEMICONDUCTOR DEVICE AND SEMICONDUCTOR DEVICE FABRICATION USING THE SAME

BACKGROUND OF THE INVENTION

1. Field of the Invention

The present invention relates to a substrate for a semiconductor device and a method of fabricating a semiconductor device comprising the substrate and a semiconductor element or an integrated circuit (IC) chip mounted thereon. More particularly, the invention relates to a substrate comprising a dielectric base material (or, a dielectric core), inner terminals for electrical connection to the semiconductor element or chip, an inner circuit electrically connected to the inner terminals, and external terminals electrically connected to the inner circuit for electrical connection to an external circuit provided outside the substrate, and a method of fabricating a semiconductor device using the substrate.

2. Description of the Related Art

In recent years, there has been the increasing need to mount a semiconductor element or IC chip and its relating electronic components on a substrate at higher density. To meet this need, the Ball Grid Array (BGA) package and the Land Grid Array (LGA) package have been developed and used practically, thereby reducing the mounting area of the packaged semiconductor device including the element or chip.

The BGA package is a type of the surface-mounting packages of the semiconductor device, in which a semiconductor element or elements is/are mounted on a substrate and electrically connected to the inner circuit of the substrate. The element or elements and the substrate are encapsulated with a resin material in such a way that the bottom of the substrate is exposed from the encapsulation material, forming a surface-mounting package. Electrodes, which are electrically connected to the element or elements, are formed on the flat bottom of the package (i.e., the substrate) in the form of grid array. Metal or conductive balls (e.g., solder bumps) are attached to the respective electrodes as external terminals for electrical connection to an external circuit provided outside the package.

The LGA package is another type of the surface-mounting packages of the semiconductor device, in which a semiconductor element or elements is/are mounted on a substrate and electrically connected to the inner circuit of the substrate. The element or elements and the substrate are encapsulated with a resin material in such a way that the bottom of the substrate is exposed from the encapsulating material, forming a surface-mounting package. This configuration is the same as the BGA package. Unlike this, Electrode pads (i.e., lands), which are electrically connected to the element or elements, are formed on the flat bottom of the package (i.e., the substrate) in the form of grid array. The pads or lands serve as the external terminals and thus, no metal balls (i.e., bumps) are attached thereto.

FIGS. 1 and 2 show an example of the conventional substrate used for the semiconductor device with the surface-mounting packages of this type. FIG. 1 shows the top view of a part of the substrate while FIG. 2 shows the bottom view thereof.

The conventional substrate 110 shown in FIGS. 1 and 2 comprises a rectangular plate-shaped, rigid, dielectric core 111 having an upper surface and a lower surface. The core 111 has a mounting area 111a on its upper surface and a land area 111b on its lower surface. A semiconductor element or IC chip (not shown) is mounted in the mounting area 111a in a later process. Lands 120 as external terminals are arranged in the form of array in the land area 111b, as shown in FIG. 2. The core 111 is typically made of dielectric material, such as woven glass cloth impregnated with epoxy resin.

A patterned, conductive layer is formed on the upper surface of the core 111, forming inner wiring lines 113 and inner terminals 114. The conductive layer is typically made of a copper foil that has been etched to have a desired pattern. The wiring lines 113 extend approximately radially from the neighborhood of the periphery of the area 111a toward the outside. The terminals 114, which are located in the mounting area 111a, are connected to the inner ends of the respective wiring lines 113. The terminals 114 are used for electrically connection to a semiconductor element or an IC chip (nor shown) to be mounted on the substrate 110 by way of thin metal wires.

A conductive runner 117 is formed on the upper surface of the core 111. The runner 117 is located near one of the edges of the core 111 and electrically connected to part of the inner wiring lines 113. The runner 117 is used for facilitating the separation of the substrate 110 in a molding process of a semiconductor element or an IC chip mounted on the core 111.

Another patterned, conductive layer is formed on the lower surface of the core 111, forming inner wiring lines 119 and external terminals or lands 120. The conductive layer is typically made of a copper foil that has been etched to have a desired pattern. The wiring lines 119 extend approximately radially from the inside of the land area 111b toward the outside. The terminals or lands 120 are connected to the inner ends of the respective wiring lines 119 and located in the area 111b. The lands 120 are used for electrically connection to an external circuit provided outside the substrate 110.

Through holes 115 are formed to vertically penetrate the core 111 to interconnect the upper and lower surfaces of the core 111 with each other. The upper openings of the holes 115 are overlapped with the respective wiring lines 113 outside the mounting area 111a while the lower openings of the holes 115 are overlapped with the respective wiring lines 119. Although not shown, the inner surfaces of the respective holes 115 are covered with a conductive layer such as a plated solder layer, in other words, the holes 115 are so-called "plated through holes". Therefore, the wiring lines 113 on the upper surface of the core 111 are electrically connected to the respective wiring lines 119 on the lower surface thereof.

In the configuration shown FIGS. 1 and 2, the core 111 has a simple dielectric layer including no wiring layers therein. However, if the core 111 has a multilayer wiring structure including inner wiring layers and inner dielectric layers laminated together, the through holes 115 are used to electrically connect the specific wiring lines 113 and 119 to the inner wiring lines as well.

The upper surface of the core 111 is entirely covered with a dielectric, solder resist layer 118 except for the region 118a exposing the mounting area 111a and the region 118b exposing the runner 117. The lower surface of the core 111 is entirely covered with a dielectric, solder resist layer 122 except for the region exposing the lands 120. Therefore, the wiring lines 113 and 119 and the top and bottom openings of the through holes 115 are actually invisible from the outside. However, to clarify the configuration of the substrate 110, they are illustrated to be visible in FIGS. 1 and 2.

Additionally, the core 111 is typically formed to be a strip, including a plurality of the structure shown in FIGS. 1 and 2. In this case, the structure of FIGS. 1 and 2 are usually aligned at equal intervals in a single direction on the core 111.

When a semiconductor device is fabricated using the substrate 110, a specific semiconductor element or IC chip (not shown) is mounted on the upper surface of the substrate 110 (i.e., the core 111) in the mounting area 111a. Next, the electrodes or bonding pads of the element or chip and the inner terminals 114 are mechanically and electrically connected to each other with thin metal wires (not shown). Thereafter, the element or chip, the metal wires, and the terminals 114 are encapsulated with a sealing or encapsulating resin material (not shown) on the upper surface of the substrate 110. If the core 111 includes a plurality of the structure shown in FIGS. 1 and 2, these process steps are conducted for each of the mounting areas 111a on the substrate 110. Finally, the substrate 110 with the elements or chips is divided into pieces, thereby forming the semiconductor devices as desired.

With the above-described conventional substrate 110 shown in FIGS. 1 and 2, the formation of the individual inner wiring lines 113 and 119, the inner terminals 114, and the external terminals or lands 120 formed on the core 111 has been completed. In other words, unlike the packaged semiconductor devices using leadframes where the lead fingers are kept electrically short-circuited until the fabrication process sequence is finalized, the lines 113 and 119, the terminals 114, and the lands 120 are kept in an electrically floating state during the fabrication process sequence. For this reason, if the substrate 110 undergoes electrical energy from the outside due to plasma processing or the like, or the substrate 110 itself is slid across or contacted with an adjoining part or member of the fabrication system during the transportation process or any subsequent process, the lines 113 and 119, the terminals 114, and the lands 120 are likely to be electrified. If so, when the electric charge on the substrate 110 is discharged instantaneously, the charge will pass through the semiconductor element or IC chip mounted on the substrate 110, resulting in the danger that the element or chip is broken electrostatically.

To solve the problem of the danger that the element or chip is broken electrostatically, various techniques have been developed. An example of the improved techniques was disclosed in the Japanese Non-Examined patent Publication No 11-340592 published in December 1999.

In the improved technique disclosed in the Publication No. 11-340592, a short-circuiting line or pattern is formed in the periphery of a printed wiring board on which a semiconductor element (i.e., an IC chip) is mounted. The short-circuiting line or pattern causes electrical short-circuit among the terminals formed on the board, thereby keeping the terminals in the same electric potential. Thus, even if the board is electrified electrostatically due to the same cause as above during the fabrication process sequence, the semiconductor element or IC chip mounted on the board is prevented from being broken electrostatically.

The short-circuiting line or pattern is cut or removed to eliminate the electrically short-circuited state among the terminals in a later step of the fabrication process sequence.

With the improved technique disclosed in the Publication No. 11-340592, however, there are the following problems.

First, with the improved technique, there is the need to form the short-circuiting line or pattern in such a way that part of the terminals are selectively short-circuited according to necessity. Therefore, when the improved technique is applied to the substrates of the type designed for semiconductor devices with the BGA or LGA package, it is often difficult to provide a space or room for the short-circuiting line or pattern on the substrate. This is because the wiring lines are arranged on the substrate at a considerably high density. As a results it is seen that the improved technique is difficult to be applied to the substrates for the BGA- or LGA-packaged semiconductor devices.

Second, since the terminals on the printed wiring board are short-circuited with the short-circuiting line or pattern, desired electrical tests for inspection are unable to be carried out just after a semiconductor element or IC chip is mounted.

Third, even if the terminals on the board are short-circuited with the short-circuiting line or pattern, the board itself is kept in an electrically floating state. Thus, it is difficult to release the electric charge from the terminals. This means that it is difficult or unable to surely prevent the semiconductor element or IC chip from being broken or damaged electrostatically.

Fourth, the improved technique necessitates a dedicated process of eliminating the short-circuiting line or pattern. Thus, the total step number of the fabrication process sequence increases.

SUMMARY OF THE INVENTION

Accordingly, an object of the present invention is to provide a substrate for a semiconductor device that prevents a semiconductor element or IC chip mounted thereon from being broken or damaged electrostatically in a fabrication process sequence of the semiconductor device, and a method of fabricating a semiconductor device using the substrate.

Another object of the present invention is to provide a substrate for a semiconductor device that eliminates easily the electrified state of the substrate in the fabrication process sequence of the semiconductor device, and a method of fabricating a semiconductor device using the substrate.

Still another object of the present invention is to provide a substrate for a semiconductor device that is applicable to a semiconductor device with high-density wiring lines, and a method of fabricating a semiconductor device using the substrate.

A further object of the present intention is to provide a substrate for a semiconductor device that makes it possible to conduct desired electric tests of a semiconductor device in its fabrication process sequence, and a method of fabricating a semiconductor device using the substrate.

A still further object of the present invention is to provide a substrate for a semiconductor device that requires no additional process in the fabrication process sequence of a semiconductor device, and a method of fabricating a semiconductor device using the substrate.

The above objects together with others not specifically mentioned will become clear to those skilled in the art from the following description.

According to a first aspect or the present invention, a substrate for a semiconductor device is provided. This substrate comprises:

(a) a dielectric core material with a first surface and a second surface;
   the core material having a mounting area on the first surface;
   the mounting area being used for mounting a semiconductor element on the first surface;

the core material having a contact area;
(b) inner terminals formed on the first surface of the core material;
the inner terminals used for electrical connection to a semiconductor element if mounted on the mounting area of the core material;
(c) external terminals formed on the second surface of the core material;
the external terminals being used for electrical connection to an external circuit provided outside the substrate; and
(d) inner wiring lines formed on the core material;
the inner wiring lines connecting electrically the inner terminals to the respective external terminals;
at least one of the Inner wiring lines extending to the contact area of the core material in such a way as to be able to contact an external conductor provided outside the substrate.

With the substrate according to the first aspect of the invention, the dielectric core material has the contact area along with the mounting area. The at least one of the inner wiring lines extends to the contact area in such a way as to be able to contact an external conductor provided outside the substrate.

Therefore, even if the substrate undergoes electrification due to some cause in a fabrication process sequence of the device and it holds electric charge, the electric charge held on the substrate will be discharged by simply contacting the at least one of the inner wiring lines located in the contact area with an external conductor provided outside the substrate (e.g., a transporting rail of a fabrication system). As a result, the electrified state of the substrata is easily eliminated in the fabrication process sequence of the semiconductor device. This means that the semiconductor element mounted on the core in its mounting area is prevented from being broken or damaged electrostatically in a fabrication process sequence of a semiconductor device.

Moreover, since the short-circuiting line or pattern disclosed in the Publication No. 11-340592 referred previously is unnecessary, the substrate according to the first aspect is applicable to a semiconductor device with high-density wiring lines. Also, due to the same reason, desired electric tests of a semiconductor device can be conducted in its fabrication process sequence.

Furthermore, the contact area of the core material can be selectively removed from the same in the process of removing the extra part of the core material and therefore, no additional process is required.

In a preferred embodiment of the substrate according to the first aspect, a first dielectric layer and a second dielectric layer are additionally provided. The first dielectric layer is formed to cover the first surface of the core material except for the mounting area, the contact area, and the inner terminals. The second dielectric layer is formed to cover the second surface of the core material except for the external terminals.

In this embodiment, preferably, each of the first and second dielectric layers is a solder resist layer.

In another preferred embodiment of the substrate according to the first aspect, the inner wiring lines located in the contact area are not electrically short-circuited with each other.

In still another preferred embodiment of the substrate according to the first aspect, the contact area is located on at least one of the first surface of the core material and the second surface thereof.

In this embodiment, the contact area is located near an edge of the core material.

In a further preferred embodiment of the substrate according to the first aspect, the contact area is located on a side of the core material that interconnects the first and second surfaces of the core material.

In this embodiment, it is preferred that through holes are additionally formed to interconnect the first and second surfaces of the core material. Inner surfaces of the holes are covered with conductive layers. The conductive layers are electrically connected to the respective inner wiring lines.

In a still further preferred embodiment of the substrate according to the first aspect, combination of the mounting area of the core material, the inner terminals, the external terminals, and the inner wiring lines constitute a device formation assembly. An additional device formation assembly having the same configuration as the device formation assembly is provided on the core material at a specific interval.

According to a second aspect of the present invention, another substrate for a semiconductor device is provided. This substrate comprises:
(a) a dielectric core material with a first surface and a second surface;
the core material having mounting areas on the first surface;
each of the mounting areas being used for mounting a semiconductor element on the first surface;
the core material having a contact area;
(b) sets of inner terminals formed on the first surface of the core material for the respective mounting areas;
each of the sets of inner terminals being used for electrical connection to a semiconductor element if mounted on one of the mounting areas of the core material;
(c) sets of external terminals formed on the second surface of the core material;
each of the sets of external terminals being used for electrical connection to an external circuit provided outside the substrate; and
(d) sets of inner wiring lines formed on the core material;
each of the sets of inner wiring lines connecting electrically one of the sets of inner terminals with a corresponding one of the sets of external terminals;
at least one of each of the sets of inner wiring lines extending to the contact area of the core material in such a way as to be able to contact an external conductor provided outside the substrate;
wherein each of the mounting areas of the core material, a corresponding one of the sets of inner terminals, a corresponding one of the sets of external terminals, and a corresponding one of the sets of inner wiring lines constitute a device formation assembly.

With the substrate according to the second aspect of the invention, the mounting areas, the sets of inner terminals, the sets of external terminals, and the sets of inner wiring lines are formed on the core material. Each of the mounting areas, a corresponding one of the sets of inner terminals, a corresponding one of the sets of external terminals, and a corresponding one of the sets of inner wiring lines constitute the device formation assembly. The combination of the core material and each of the device formation assemblies corresponds approximately to the substrate of the first aspect.

Thus, it is said that the combination of the core material and each of the device formation assemblies in the substrate of the second aspect has substantially the same configuration as that of the substrate of the first aspect. As a result, the substrate of the second aspect has the same advantages as those of the substrate according to the first aspect.

In a preferred embodiment of the substrate according to the second aspect, a first dielectric layer and a second dielectric layer are additionally provided. The first dielectric layer is formed to cover the first surface of the core material except for the mounting areas, the sets of contact areas, and the sets of inner terminals. The second dielectric layer is formed to cover the second surface of the core material except for the sets of external terminals.

In this embodiment, preferably, each of the first and second dielectric layers is a solder resist layer.

In another preferred embodiment of the substrate according to the second aspect, the sets of inner wiring lines located in the contact area are not electrically short-circuited with each other.

In still another preferred embodiment of the substrate according to the second aspect, the contact area is located on at least one of the first surface of the core material and the second surface thereof.

In this embodiment, the contact area is located near an edge of the core material.

In a further preferred embodiment of the substrate according to the second aspect, the contact area is located on a side of the core material that interconnects the first and second surfaces of the core material.

In this embodiment, it is preferred that through holes are additionally formed to interconnect the first and second surfaces of the core material. Inner surfaces of the holes are covered with conductive layers. The conductive layers are electrically connected to the respective sets of inner wiring lines.

In a still further preferred embodiment of the substrate according to the second aspect, the device formation assemblies are arranged at regular intervals along an axis of the core material. The contact area is commonly used for all the device formation assemblies.

According to a third aspect of the present invention, a method of fabricating a semiconductor device using the substrate according to the second aspect is provided. This method comprises the steps of:

(a) providing a substrate according to the second aspect of the invention;

(b) mounting a semiconductor element on each of the mounting areas of the substrate;

(c) making electrical interconnection between the semiconductor element mounted in each of the mounting areas and a corresponding one of the sets of inner terminals; and (d) cutting the substrate to separate the device formation assemblies including the respective semiconductor elements from each other, thereby forming semiconductor devices;

the contact area of the substrate being separated from all the semiconductor devices in the process of cutting the substrate.

With the method of fabricating a semiconductor device according to the third aspect of the invention, after the substrate according to the second aspect is provided, the semiconductor element is mounted on each of the counting areas of the substrate, electrical interconnection is made between the semiconductor element mounted in each of the mounting areas and a corresponding one of the sets of inner terminals, and substrate is cut to separate the device formation assemblies including the respective semiconductor elements from each other, thereby forming semiconductor devices.

Therefore, the electrified state of the substrate is easily eliminated in the fabrication process sequence of the semiconductor device. This means that the semiconductor elements mounted on the substrate are prevented from being broken or damaged electrostatically in the fabrication process sequence.

Also, since the substrate according to the second aspect is used, the semiconductor device with high-density wiring lines can be fabricated and at the same time, desired electric tests of the semiconductor device can be conducted in its fabrication process sequence.

Additionally, the contact area of the substrate is separated from all the semiconductor devices in the step (d) of cutting the substrate and therefore, no additional process is required in the fabrication process sequence of the device. In other words, the total number of the necessary fabrication process steps does not increase.

In a preferred embodiment of the method according to the third aspect, the substrate is cut in the step (d) in such a way that cutting action progresses along a cutting line that surrounds each of the device formation assemblies. The contact area of the core material is excluded from all the cutting lines.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
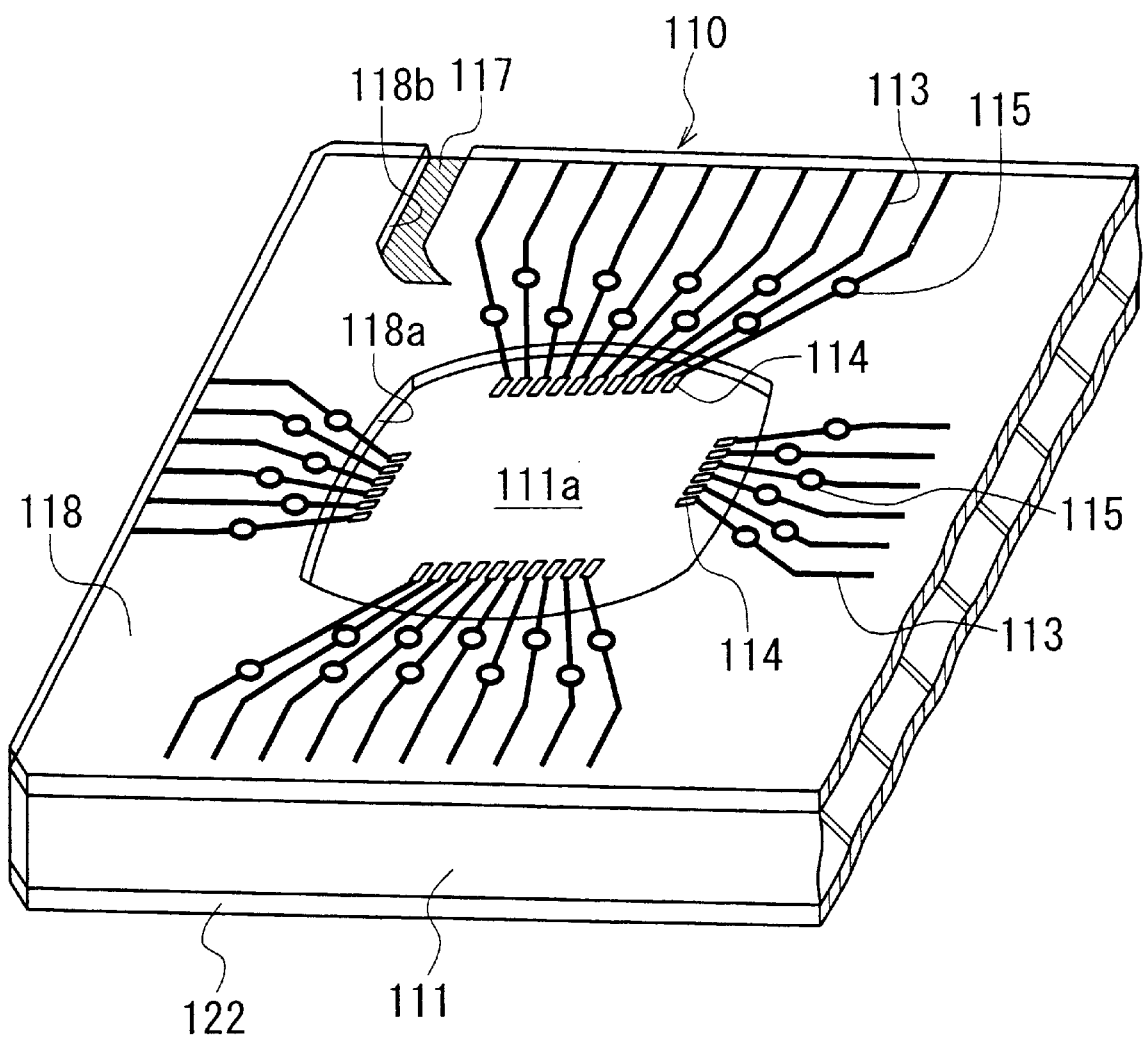
FIG. 1 is a schematic, partial perspective view showing the configuration of a conventional substrate for a semiconductor device, in which the upper surface side of the substrate is shown.
Figure 2:
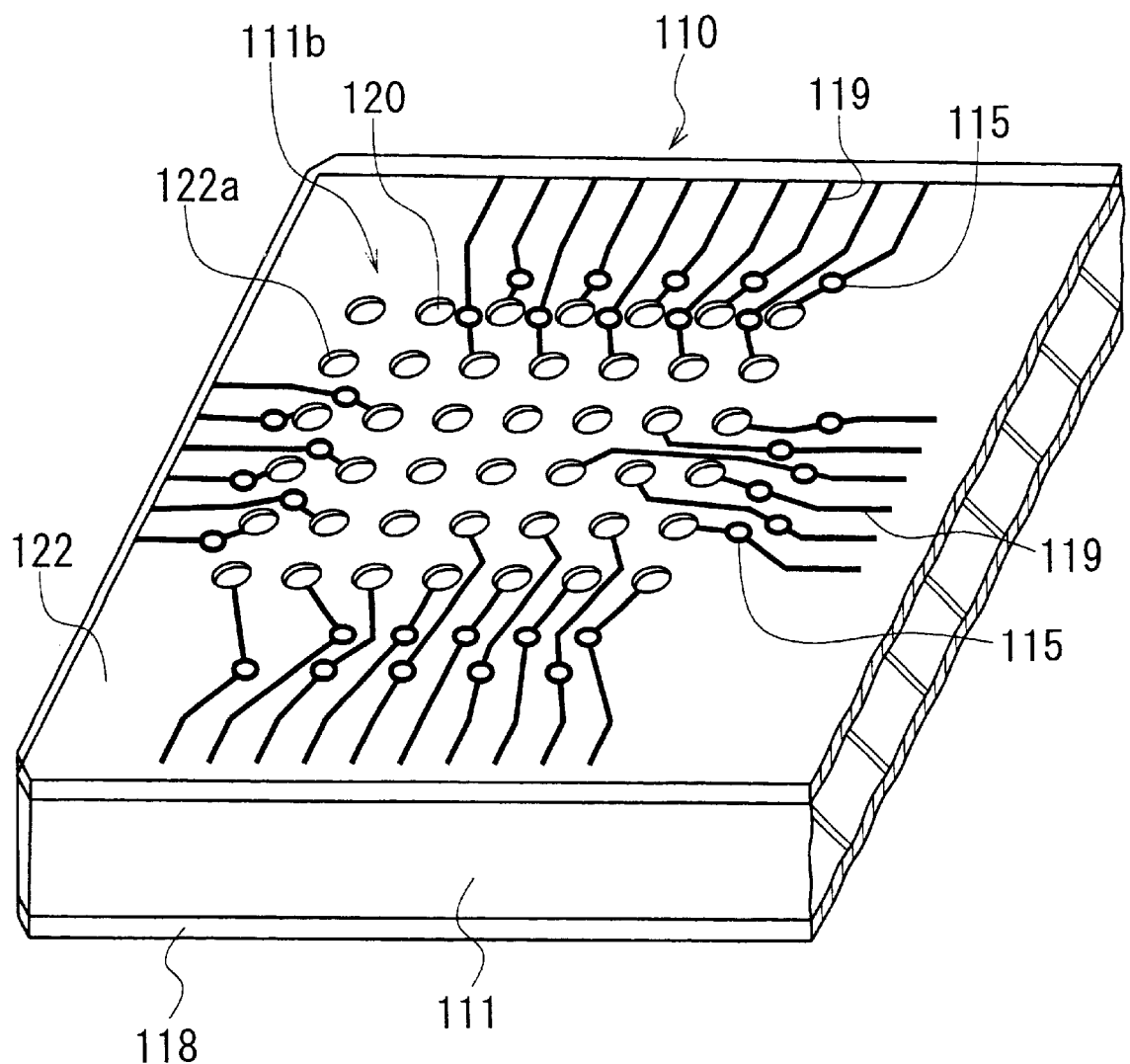
FIG. 2 is a schematic, partial perspective view showing the configuration of the conventional substrate of FIG. 1, in which the lower surface side of the substrate is shown.

Preferred embodiments of the present invention will be described in detail below while referring to the drawings attached.

First Embodiment

A substrate for a semiconductor device according to a first embodiment of the invention is shown in FIGS. 3 to 6.

As shown in FIGS. 3 to 6, the substrate 10 according to the first embodiment comprises a rectangular plate-shaped, rigid dielectric core material 11 having an upper surface and a lower surface. As seen from FIGS. 5 and 6, the core material 11 is strip-shaped and has four mounting areas 11a on its upper surface and four land areas 11b on its lower surface. The areas 11a and 11b are arranged at equal intervals along the longitudinal axis of the care material 11. The core material 11 is typically made of a proper dielectric material, such as woven glass cloth impregnated with epoxy resin.

Figure 4:
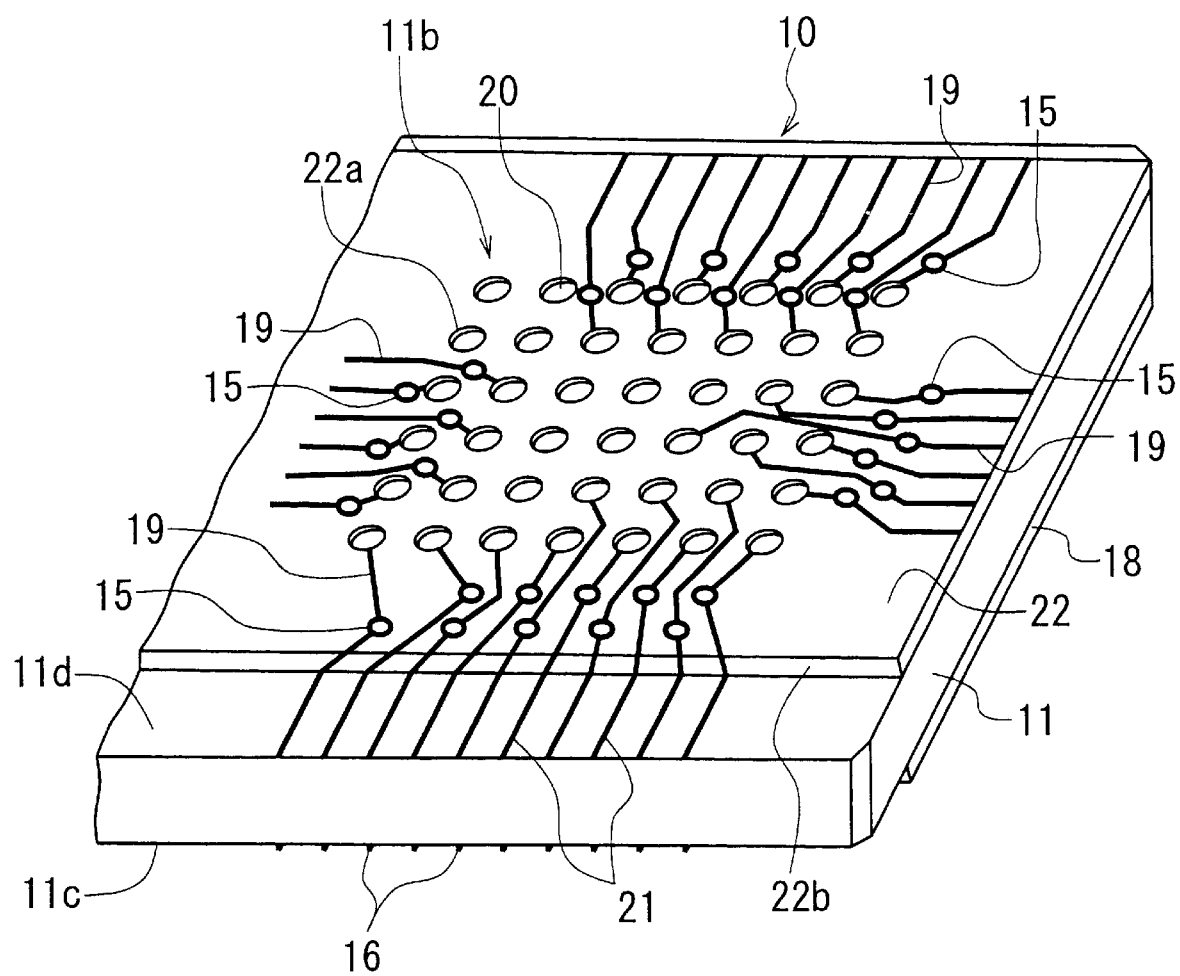
FIG. 4 is a schematic, partial perspective view showing the configuration of the substrate according to the first embodiment of FIG. 3, in which the lower surface side of the substrate is shown.
Figure 7:
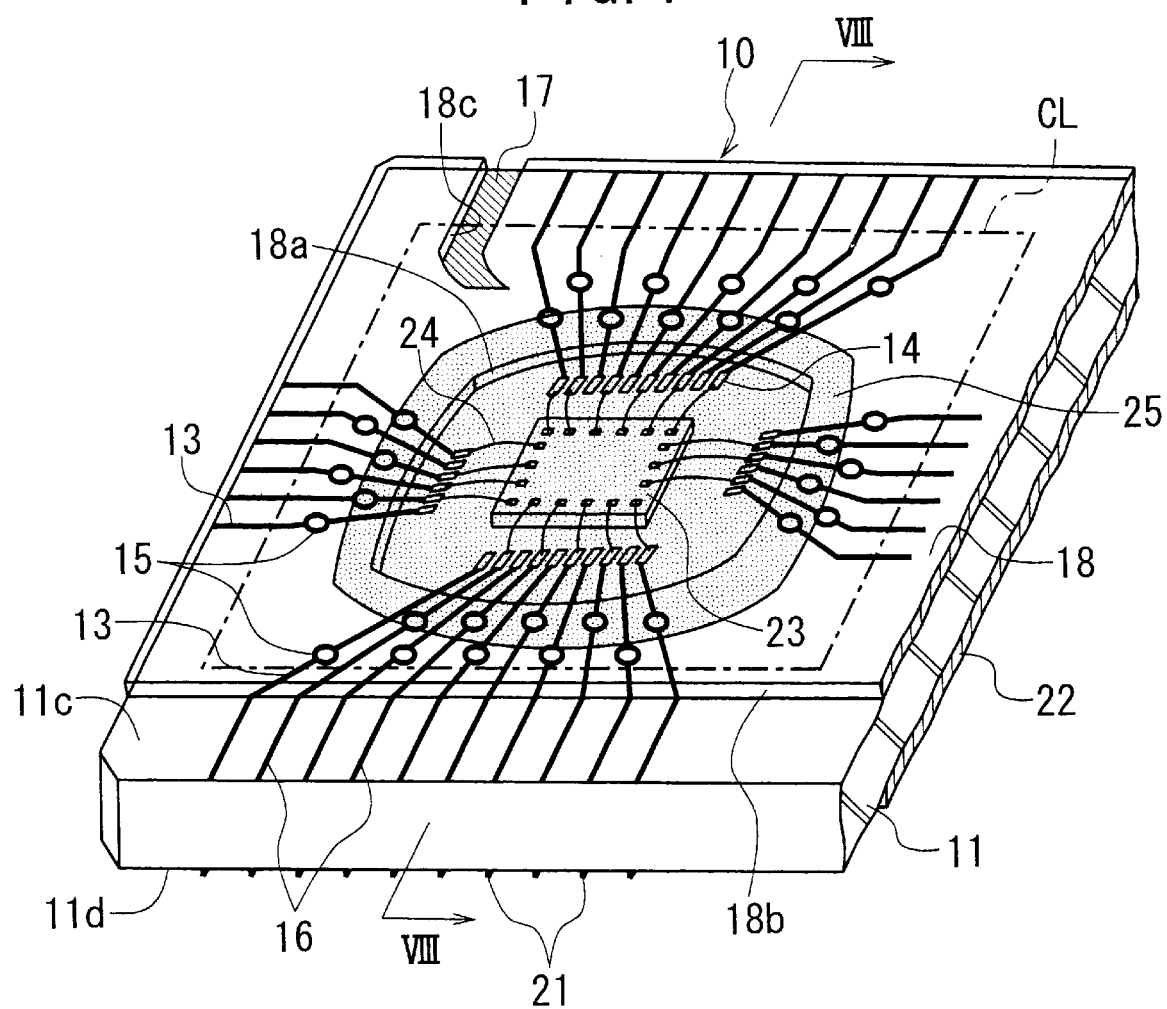
FIG. 7 is a schematic, partial, perspective view showing the configuration of the substrate according to the first embodiment of FIG. 3, in which a semiconductor element or IC chip is mounted on the substrate and encapsulated.
Figure 8:
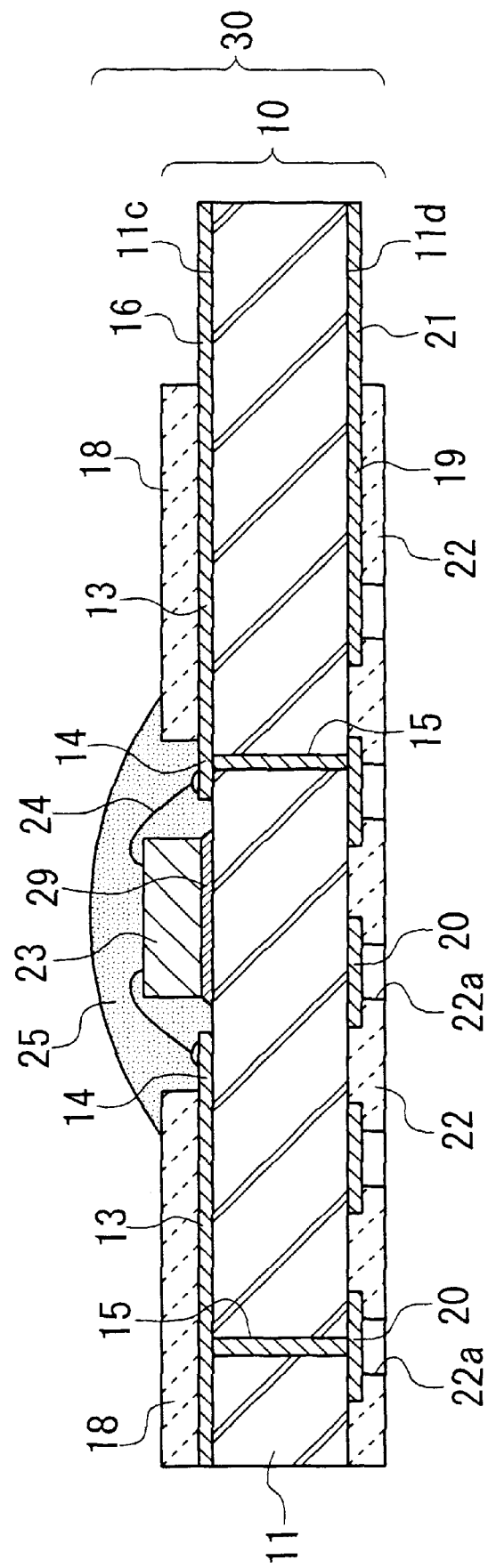
FIG. 8 is a schematic, partial cross-sectional view taken along the line VIII—VIII in FIG. 7.

A semiconductor element or an IC chip 23 is mounted in each mounting area 11a in a later process, as shown in FIGS. 7 and 8. Lands 20 as external terminals are arranged in the form of array in each land area 11b, as shown in FIG. 4.

A patterned conductive layer is formed on the upper surface of the core material 11, forming inner wiring lines 13 and inner terminals 14. The conductive layer is typically made of a copper foil that has been etched to have a desired pattern. The wiring lines 13 extend approximately radially from the neighborhood of the periphery of each mounting area 11a toward the outside. The terminals 14 are connected to the inner ends of the respective wiring lines 13 and located in each area 11a. The terminals 14 are used for electrical connection to the semiconductor element or an IC chip 23 to be mounted on the substrate 10 by way of thin metal wires 24, as shown in FIG. 7.

A conductive runner 17 is formed on the upper surface of the core material 11. The runner 17 is located near one of the edges of the core material 11 and electrically connected to part of the inner wiring lines 13. The runner 17 is used for facilitating the separation of the substrate 10 in a molding process of the semiconductor elements 23 mounted on the upper surface of the core material 11.

Another patterned, conductive layer is formed on the lower surface of the core material 11, forming inner wiring lines 19 and external terminals or lands 20. The conductive layer is typically made of a copper foil teat has been etched to have a desired pattern. The wiring lines 19 extend approximately radially from the inside of each mounting area 11b toward the outside. The terminals or conductive lands 20 are connected to the inner ends of the respective wiring lines 19 and located in each land area 11b. The lands 20 are used for electrical interconnection between the semiconductor element 23 and an external circuit (not shown) provided outside the substrate 10.

Through holes 15 are formed to vertically penetrate the core material 11 to interconnect its upper and lower surfaces with each other. The upper openings of the holes 15 are overlapped with the respective wiring lines 13 while the lower openings of the holes 15 are overlapped with the respective wiring lines 19. Although not shown, the inner surfaces of the holes 15 are covered with a conductive layer such as a plated solder layer, in other words, the holes 15 are so-called "plated through holes". Therefore, the lines 13 on the upper surface of the core material 11 are electrically connected to the respective lines 19 on the lower surface thereof by way of the plated through holes 15.

Instead of the plated through holes, ordinary through holes may be used if each of the holes is filled with any conductive material to electrically interconnect the lines 13 and 19 with each other. Any other interconnection structure may be used for this purpose.

Figure 3:
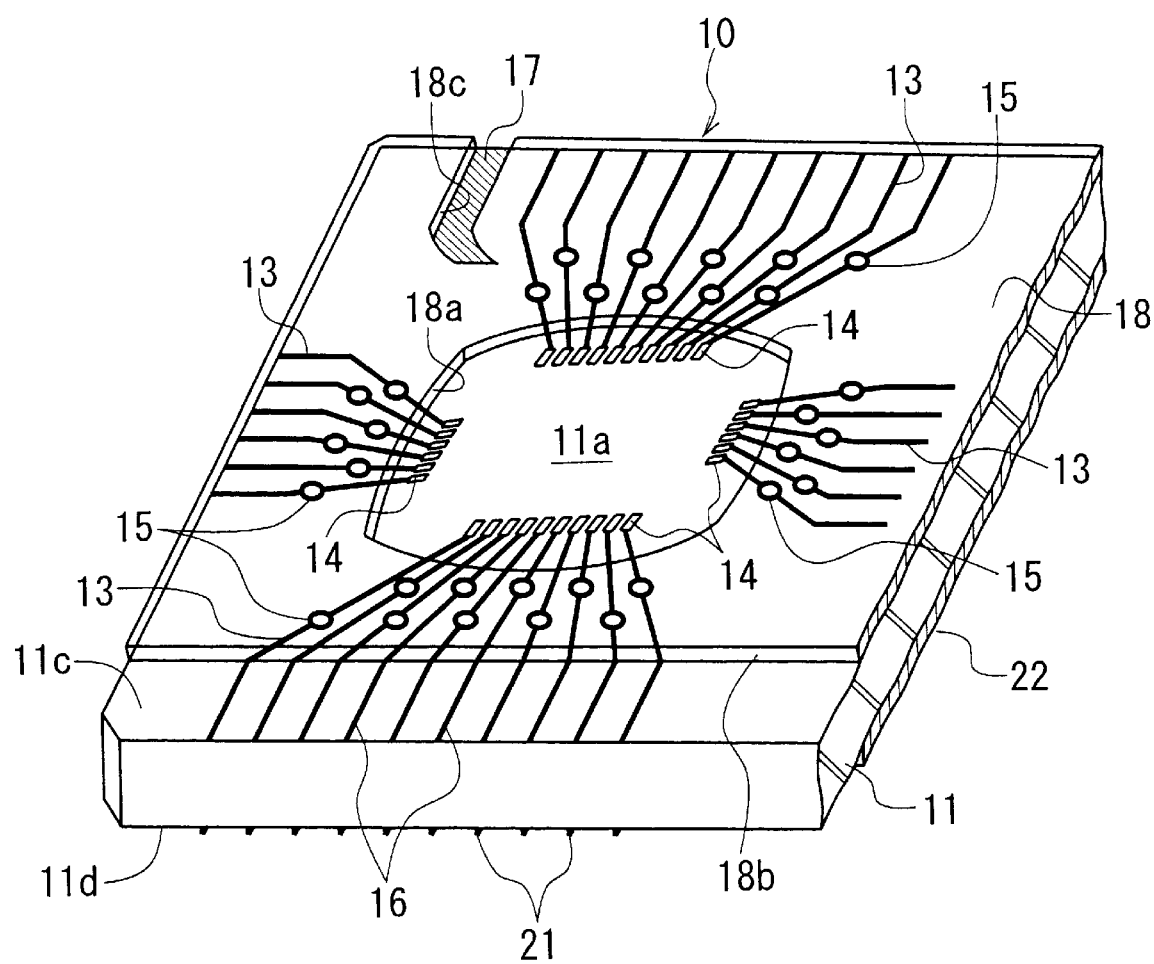
FIG. 3 is a schematic, partial perspective view showing the configuration of a substrate for a semiconductor device according to a first embodiment of the invention, in which the upper surface side of the substrate is shown.

In the configuration shown FIGS. 3 and 4, the core material 11 has a simple dielectric layer including no wiring layers therein. However, the core material 11 may have a multilayer wiring structure In this case, the core material 11 includes inner wiring layers and inner dielectric layers laminated together. The through holes 15 are used to electrically connect the specific wiring lines 13 and 19 to the inner wiring lines as well.

The upper surface of the core material 11 is entirely covered with a dielectric solder resist layer 18 except for the parts overlapped with the windows 18a, 18b, and 18c of the layer 18. The mounting area 11a is entirely exposed through the window 18a. The runner 17 is exposed through the window 18c. The part of the core material 11 exposed through the window 18b is a contact area 11c, which is located on the upper surface of the core material 11. Part of the inner wiring lines 13 are extended to the contact area 11c and exposed from the layer 18. The exposed lines 13 in the area 11c are termed the exposed wiring lines 16". Thus, these exposed lines 16 are easily contacted with and electrically connected to any member outside the substrate 10.

The lower surface of the core 11 is entirely covered with a solder resist layer 22 except for the parts overlapped with the windows 22a and 22b. The land area 11b are partially exposed from the layer 22 by way of the respective small circular windows 22a, thereby exposing the respective lands 20 from the layer 22. The part of the core material 11 exposed through the window 22b is a contact area 11d, which is located on the lower surface of the core material 11. Part or the inner wiring lines 19 are extended to the area 11d and exposed from the layer 22. The exposed lines 19 in the area 11d are termed the "exposed wiring lines 21". Thus, these exposed lines 21 are easily contacted with and electrically connected to any member outside the substrate 10.

Almost all the wiring lines 13 and 19 and all the openings of the through holes 15 are covered with the solder resist layer 18 or 22 and therefore, they are actually invisible from the outside. However, to clarify the configuration of the substrate 10 according to the first embodiment, they are illustrated to be visible in FIGS. 3 and 4 and other figures.

Figure 5:
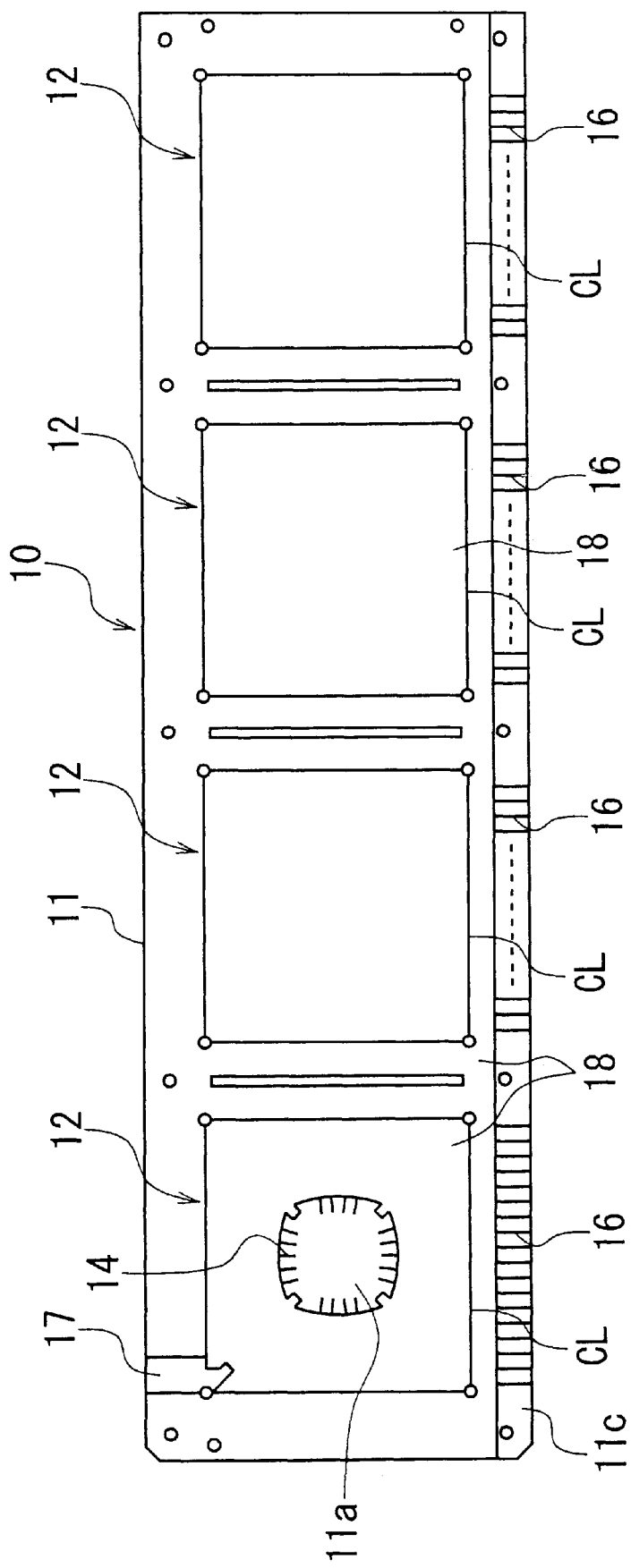
FIG. 5 is a schematic plan view showing the configuration of the substrate according to the first embodiment of FIG. 3, in which the upper surface side of the substrate is entirely shown.
Figure 6:
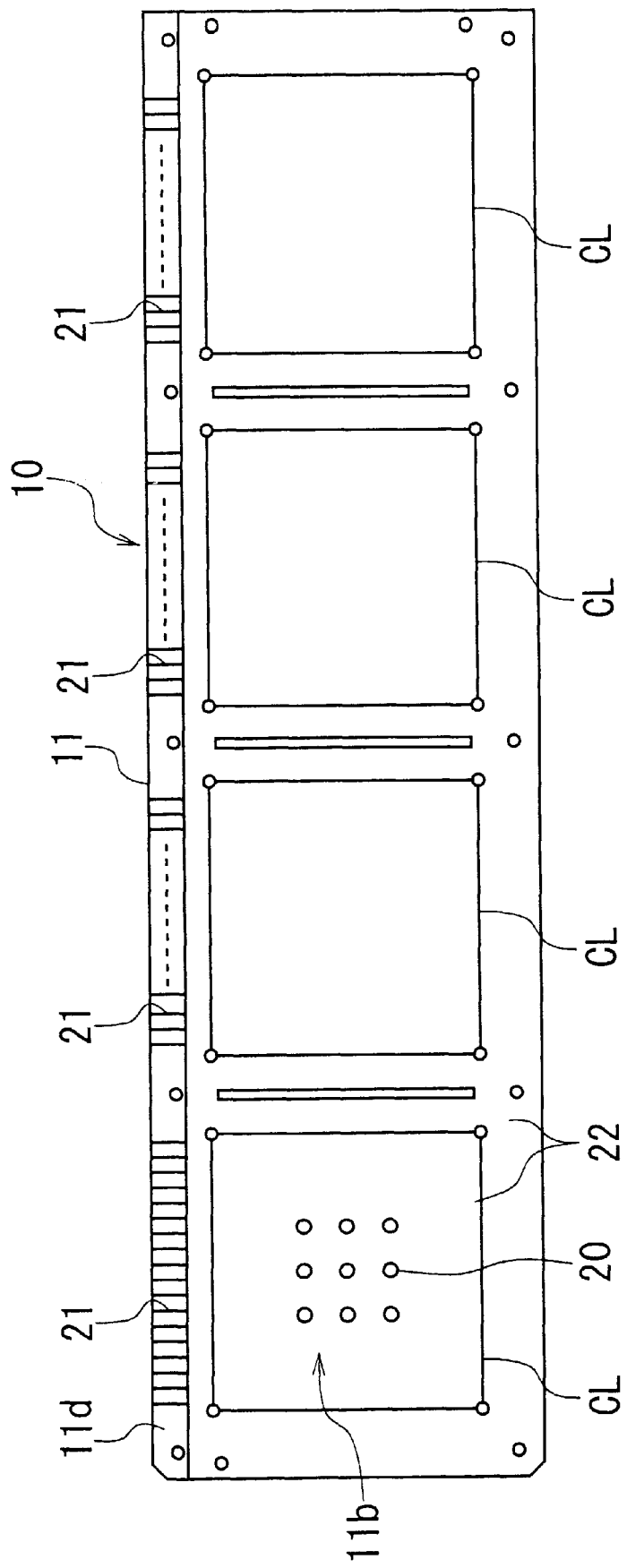
FIG. 6 is a schematic plan view showing the configuration of the substrate according to the first embodiment of FIG. 3, in which the lower surface side of the substrate is entirely shown.

Additionally, as seen from FIGS. 5 and 6, the core material 11 is actually strip-shaped. Here, the combination of one of the mounting areas 11a of the core material 11 and the relating inner terminals 14, external terminals 20, and inner wiring lines 13 and 19 is defined as a "device formation assembly 12". In the first embodiment, as shown in FIGS. 5 and 6, the core material 11 includes the four equal device formation assemblies 12. The assemblies 12 are aligned at equal intervals along the longitudinal axis of the core material 11.

The exposed wiring lines 16 in the upper contact area 11c appear like the teeth off a comb, as shown in FIG. 5. Similarly, the exposed wiring lines 21 in the lower contact area 11d appear like the teeth of a comb, as shown in FIG. 6.

With the above-described substrate 10 according to the first embodiment shown in FIGS. 3 to 6, the dielectric core material 11 has the upper and lower contact areas 11c and 11d at its side. The exposed wiring lines 16, which are electrically connected to the inner wiring lines 13, are located in the upper contact area 11c. Similarly, the exposed wiring lines 21, which are electrically connected to the inner wiring lines 19, are located in the lower contact area 11d. The exposed lines 16 and 21 are able to contact an external conductor provided outside the substrate 10 during the transportation process of the substrate 10.

Therefore, even if the substrate 10 undergoes electrification due to some cause in the fabrication process sequence of a semiconductor device and it holds electric charge, the electric charge held on the substrata 10 will be discharged by simply contacting at least one of the exposed wiring lines 16 and 21 located in the contact area 11c or 11d with an external conductor (e.g., a transporting rail or storing container of the fabrication system).

As a result, the electrified stats of the substrate 10 is easily eliminated in the fabrication process sequence of the semiconductor device. This means that each semiconductor element mounted on the core element 11 in its mounting area 11a is prevented from being broken or damaged electrostatically in its fabrication process sequence.

Moreover, since the short-circuiting line or pattern disclosed in the Publication No. 11-340592 referred previously is unnecessary, the substrate 10 according to the first embodiment is applicable to a semiconductor device with high-density wiring lines. Also, due to the same reason, desired electric tests of a semiconductor device can be conducted in its fabrication process sequence.

Furthermore, the contact areas 11c and 11d of the core material 11 can be selectively removed from the same in the process of removing the extra part of the core material 11 and therefore, no additional process is required.

In the substrate 10 according to the first embodiment, since the core material 11 has the upper and lower contact areas 11c and 11d, there is an additional advantage that the possibility of at least one of the areas 11c and 11d to contact with an external conductor of the fabrication system is high compared with the case where only one of the areas 11c and 11d is provided.

Figure 9:
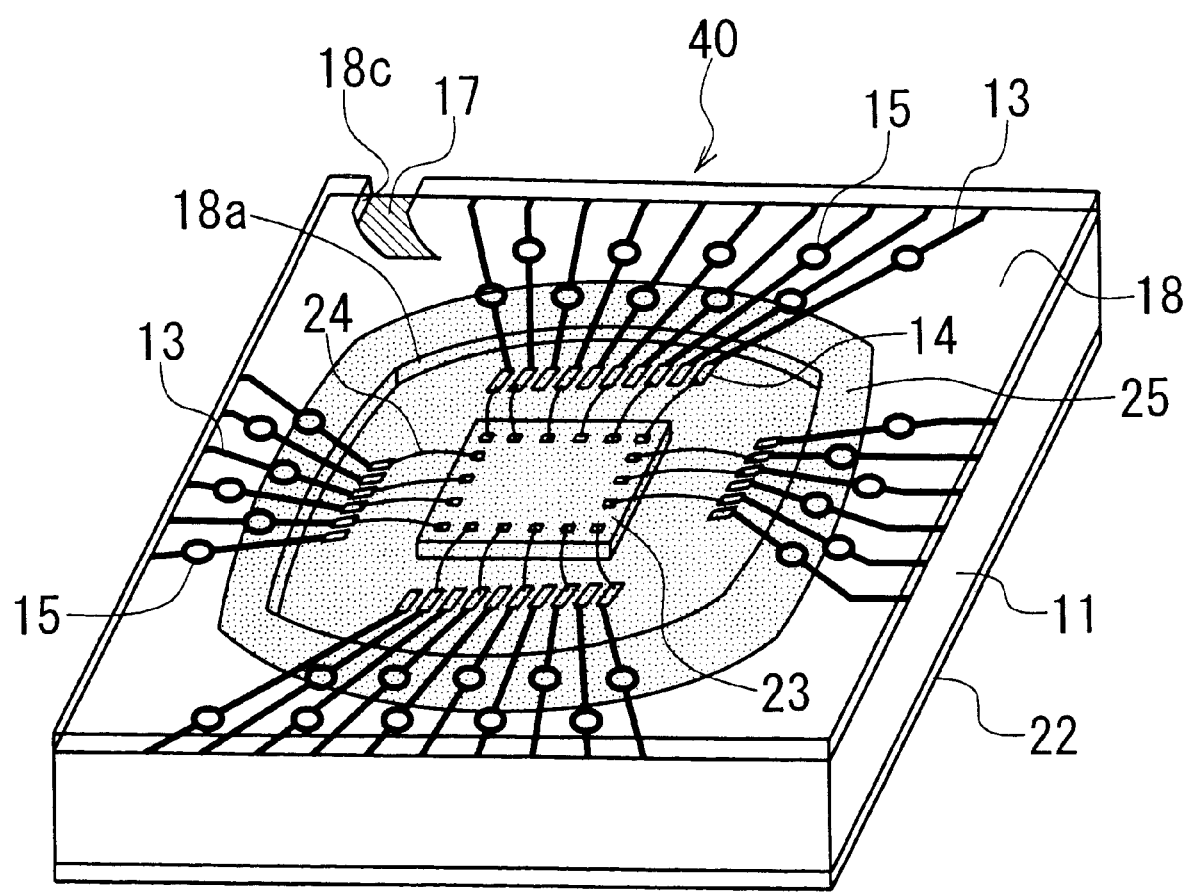
FIG. 9 is a schematic perspective view showing the configuration of a semiconductor device fabricated by a method according to the first embodiment.

A semiconductor device 40 as shown in FIG. 9 is fabricated by using the substrate 10 according to the first embodiment. A method of fabricating the device 40 is explained below.

After the above-described substrate 10 is formed, specific semiconductor elements or IC chips 23 are mounted on the respective mounting areas 11a on the upper surface of the core material 11 with an adhesive 29, as shown in FIGS. 7 and 8.

Next, the bonding pads or electrodes of each element 23 and the inner terminals 14 of the substrate 11 are mechanically and electrically connected to each other with thin metal wires (i.e., conductive bonding wire) 24, respectively. Thereafter, the element 23, the metal wires 24, and the terminal 14 on each mounting area 11a are encapsulated with a sealing or encapsulating resin material 25 on the upper surface of the substrate 10. Thus, the combined structure 30 is constituted.

These processes are conducted in each mounting area 11a. Since the core material 11 includes the four mounting areas 11a (i.e., four device formation assemblies 12), these processes are repeated four times. The state at this stage is shown in FIGS. 7 and 8.

Finally, the structure 30 including the substrate 10 with the mounted and encapsulated elements 23 is divided into four pieces by cutting operation in a known process, thereby forming the semiconductor devices 40 shown in FIG. 9. The cutting operation is carried out along the approximately square cutting lines CL, as shown in FIGS. 5 and 6. In this process, the upper and lower contact areas 11c and 11d of the core material 11 are automatically separated from the devices 40. This is because each cutting line CL is defined to surround the mounting area 11a and the necessary part of the inner wiring lines 13 and 21, as clearly shown in FIG. 7. Thus, no additional process is required for cutting the contact areas 11c and 11d.

Second Embodiment

Figure 10:
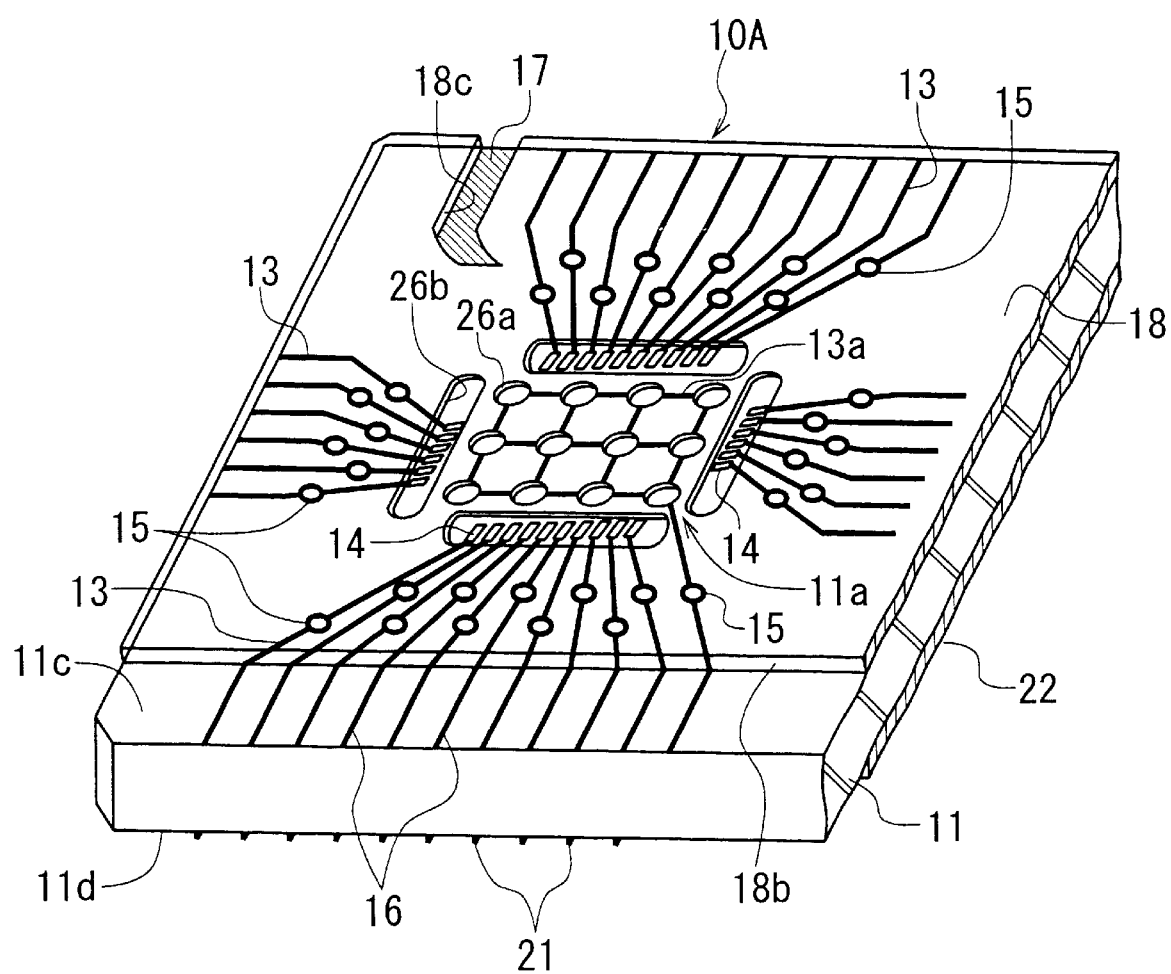
FIG. 10 is a schematic, partial perspective view showing the configuration of a substrate for a semiconductor device according to a second embodiment of the invention, in which the upper surface side of the substrate is shown.

FIG. 10 shows the configuration of a semiconductor substrate 10A according to a second embodiment of the invention.

In the above-described substrate 10 according to the first embodiment, the solder resist layer 18 does not cover the mounting areas 11a of the core material 11 in which the semiconductor elements 23 are respectively mounted. However, the invention is not limited to this structure. It is needless to say the solder resist layer 18 is formed to cover each mounting area 11a, as shown by the substrate 11A of the second embodiment.

As shown in FIG. 10, the substrate 10A comprises the same configuration as the substrate 10 of the first embodiment as shown in FIGS. 3 to 6, except that additional inner wiring lines 13a are provided, and that windows 26a and 26b are provided in the solder resist layer 18. Therefore, the detailed description about the same configuration is omitted here for the sake of simplification of description by attaching the same reference numerals as used in the first embodiment to the same elements in FIG. 10.

The additional inner wiring lines 13a are formed in each mounting area 11a. The windows or openings 26a, which are circular, are formed in the solder resist layer 18 in each area 11a, exposing the lines 13a from the layer 18 on the upper surface of the core material 11. Part of the inner wiring lines 13a is/are extended to the upper contact area 11b to and exposed from the layer 18 through the window 18b.

Also, the windows or openings 26b, which are elongated, are formed in the solder resist layer 18 to expose the inner terminals 14 therefrom. The semiconductor element 23 is mounted on the layer 18 in such a way that the electrodes or bonding pads of the element 23 are electrically connected to the wiring lines 13a by way of the windows 26a. At this time, the electrodes or bonding pads of the element 23 are electrically connected to the inner terminals 14 by way of the windows 26b.

With the substrate 10A according to the second embodiment shown in FIG. 10, the exposed wiring lines 16 and the additional wiring lines 13a are located in the upper contact area 11c in such a way as to be able to contact an external conductor provided outside the substrate 10A. Therefore, even if the substrate 10A undergoes electrification due to some cause in a fabrication process sequence of the semiconductor device 40, the electric charge held on the substrate 10A will be discharged by simply contacting any of the inner wiring lines 16, 13a, and 21 located in the contact areas 11c and 11d with an external conductor provided outside the substrate 10A. As a result, the semiconductor element or IC chips 23 mounted on the core material 11 in its mounting areas 11a are prevented from being broken or damaged electrostatically in a fabrication process sequence of the device 40.

Moreover, since the short-circuiting line or pattern disclosed in the Publication No. 11-340592 referred previously is unnecessary, the substrate 10A according to the second embodiment is applicable to the semiconductor device 40 with high-density wiring lines 13, 13*a,* and 19. Also, due to the same reason, desired electric tests of the semiconductor device 40 can be conducted in its fabrication process sequence.

Furthermore, the contact areas 11*c* and 11*d* of the core material 11 can be selectively removed from the same in the process of removing the extra part of the core material 11 and therefore, no additional process is required.

Third Embodiment

Figure 11:
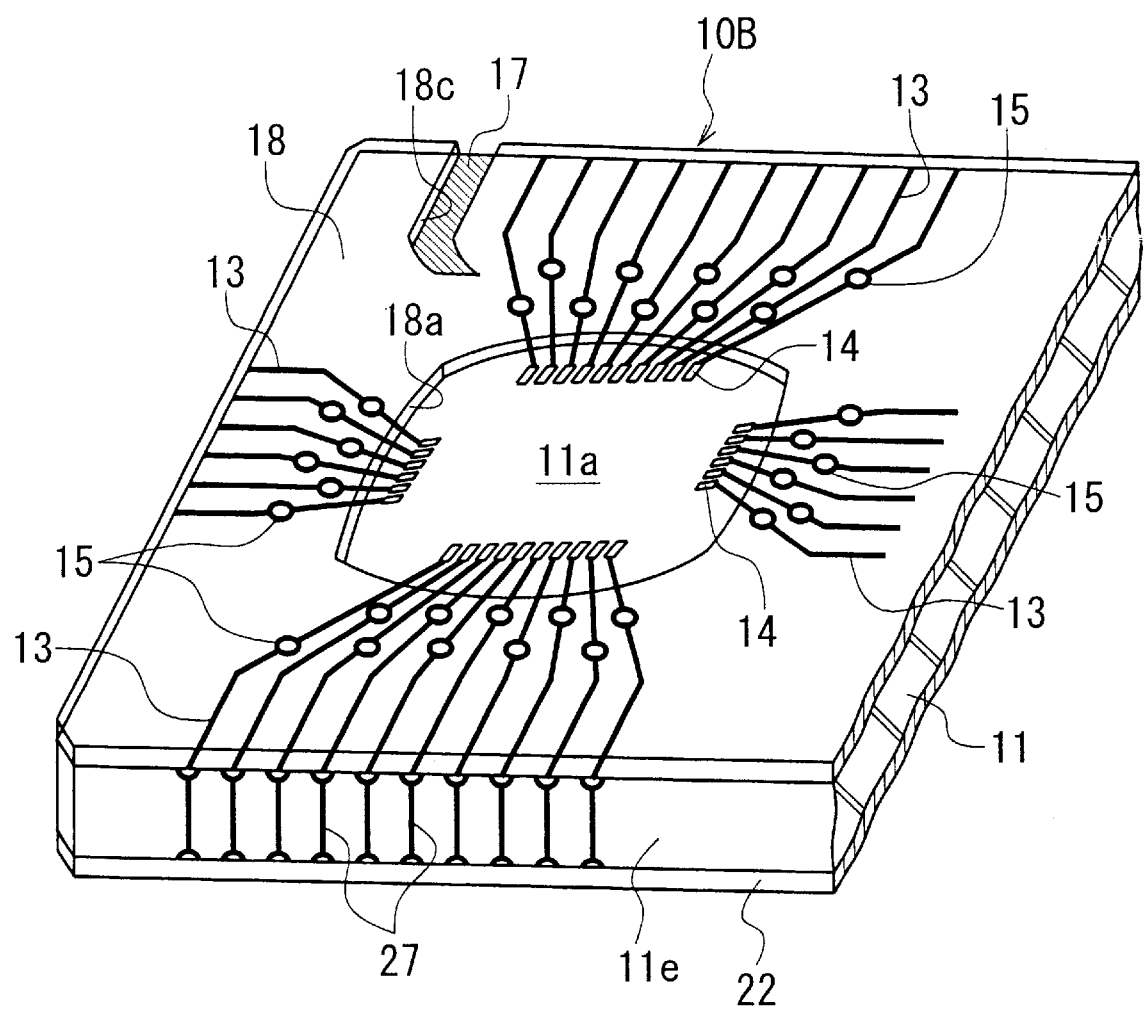
FIG. 11 is a schematic, partial perspective view showing the configuration of a substrate for a semiconductor device according to a third embodiment of the invention, in which the upper surface side of the substrate is shown.

FIG. 11 shows the configuration of a semiconductor substrate 10B according to a third embodiment of the invention. In this embodiment, the upper and lower contact areas 11*c* and 11*d* provided in the first and second embodiments are eliminated and thus, no part protruding laterally from the solder resist layers 18 and 22. Instead, plated "dummy" through holes 27 are formed on the side face 11*e* of the core material 11. The side face 11*a* serves as a contact area. Unlike the first and second embodiments, the width of the solder resist layers 18 and 22 are equal to that of the core material 11. The other configuration is the same as the substrate 10 according to the first embodiment.

The holes 27, which have the same semicircular cross section, are formed on the vertical side face 11*e* of the core material 11. Part of the inner wiring lines 13 on the upper surface of the core material 11 are mechanically and electrically connected to the inner wiring lines 21 on the lower surface thereof by way of the conductor layers (i.e., plated solder layers) formed on the inner surfaces of the respective holes 27.

In the substrate 10B according to the third embodiment, the solder resist layers 18 and 22 are formed to cover all the entire upper and lower surfaces of the core material 11 except for the mounting areas 11*a,* the land areas 11*b,* and the runner 17. Thus, unlike the first and second embodiments, the width of the layers 18 and 22 are approximately the same as that of the core material 11 (i.e., the substrate 10B).

With the substrate 10B according to the third embodiment shown in FIG. 11, the plated "dummy" through holes 27, which are electrically connected to the part of the inner wiring lines 13 and the part of the wiring lines 21, are located on the side face 11*e* of the core material 11. The conductive holes 27 on the face 11*e* are able to contact an external conductor provided outside the substrate 10B similar to the first and second embodiments.

Therefore, even if the substrate 10B undergoes electrification due to some cause in a fabrication process sequence of the semiconductor device 40, the electric charge held on the substrate 10B will be discharged. As a result, the semiconductor elements 23 mounted on the substrate 10B in its mounting areas 11*a* are prevented from being broken or damaged electrostatically in a fabrication process sequence of the device 40.

Moreover, the substrate 10B is applicable to the semiconductor device 40 with high-density wiring lines 16 and 21 and desired electric tests of the semiconductor device 40 can be conducted in its fabrication process sequence. No additional process is required.

Variations

It is needless to say that the invention is not limited to the above-described first and second embodiments. For example, the core material has one contact area or two in the respective substrates according to the first to third embodiments. However, the core material may have three or more contact areas as necessary at or near the same edge or different edges of the material.

Also the shape and structure of the contact area is not limited to these embodiments. Any other shape and structure may be adopted for this purpose if is allows the contact area to contact any member provided outside the substrate.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A substrate for a semiconductor device, comprising:
  a dielectric core mater al with a first surface and a second surface, the core material having a mounting area on the first surface for mounting a semiconductor element on the first surface, the core material having a contact area;
  inner terminals formed on the first surface of the core material for electrical connection to a semiconductor element mounted on the mounting area of the core material;
  external terminals for ed on the second surface of the core material for electrical connection to an external circuit provided outside the substrate;
  inner wiring lines for ed on the core material, the inner wiring lines connecting electrically the inner terminals to the respective external terminals, at least one of the inner wiring lines extending to the contact area of the core material in such a way as t be able to contact an external conductor provided outside the substrate; and
  a first dielectric layer and a second dielectric layer, wherein the first dielectric layer is formed to cover the first surface of the core material except for the mounting area, the contact area, and the inner terminals, and wherein the second dielectric layer is formed to cover the second surface of the core material except for the external terminals.

2. The substrate according to claim 1, wherein each of the first and second dielectric layers is a solder resist layer.

3. The substrate according to claim 1, wherein the inner wiring lines located in the contact area are not electrically short-circuited with each other.

4. The substrate according to claim 1, wherein the contact area is located on at least one of the first surface of the core material and the second surface thereof.

5. The substrate according to claim 4, wherein the contact area is located near an edge of the core material.

6. The substrate according to claim 1, wherein the contact area is located on a side of the core material that interconnects the first and second surfaces of the core material.

7. The substrate according to claim 6, further comprising through holes formed to interconnect the first and second surfaces of the core material, wherein inner surfaces of the holes are covered with conductive layers, and wherein the conductive layers are electrically connected to the respective inner wiring lines.

8. The substrate according to claim 6, wherein the combination of the mounting area of the core material, the inner terminals, the external terminals, and the inner wiring lines constitute a device formation assembly, and wherein the substrate further comprises an additional device formation assembly on the core material, the additional device assembly having the same configuration as the device formation assembly and being located at a specific interval from the device assembly.

9. A substrate for a semiconductor device, comprising:

a dielectric core material with a first surface and a second surface, the core material having mounting areas on the first surface for mounting respective semiconductor elements on he first surface, the core material having a contact area;

sets of inner terminal formed on the first surface of the core material at the respective mounting are s for electrical connection to a semiconductor element mounted on one of the mounting areas of the core material;

sets of external terminals formed on the second surface of the core material for electrical connection to an external circuit provided outside the substrate;

sets of inner wiring un s formed on the core material, each of the sets of inner wiring lines connecting electrically one of the sets of inner terminals with a corresponding one of the set of external terminals, at least one of each of the sets of inner wiring lines extending to the contact area of the core material in such a way as to be able to contact an external conductor provided outside the substrate; and a first dielectric layer and a second dielectric layer, wherein the first dielectric layer is formed to over the first surface of the core material except for the mounting areas, the sets of contact areas, and the sets of inner terminals, and wherein the second dielectric layer is formed to cover the second surface of the core material except for the sets of external terminals, wherein each of the mounting areas of the core material, a corresponding one of the sets of inner terminals, a corresponding one of the sets of external terminals, and a corresponding one of the sets of inner wiring lines constitute a device formation assembly.

10. The substrate according to claim 9, wherein each of the first and second dielectric layers is a solder resist layer.

11. The substrate according to claim 9, wherein the sets of inner wiring lines located in the contact area are not electrically short-circuited with each other.

12. The substrate according to claim 9, wherein the contact area is located on at least one of the first surface of the core material and the second surface thereof.

13. The substrate according to claim 12, wherein the contact area is located near an edge of the ore material.

14. The substrate according to claim 9, wherein the contact area is located on a side of the core material that interconnects the first and second surfaces of the core material.

15. The substrate according to claim 14, further comprising through holes formed to interconnect the first and second surfaces of the core material, wherein inner surfaces of the holes are covered with conductive layers, and wherein the conductive layers are electrically connected to the respective sets of inner wiring lines.

16. The substrate according to claim 9, wherein the device formation assemblies are arranged at regular intervals along an axis of the core material, and wherein the contact area is shared by all the device formation assemblies.

* * * * *

UNITED STATES PATENT AND TRADEMARK OFFICE
CERTIFICATE OF CORRECTION

PATENT NO. : 6,627,986 B2
DATED : September 30, 2003
INVENTOR(S) : Ishihara et al.

It is certified that error appears in the above-identified patent and that said Letters Patent is hereby corrected as shown below:

<u>Title page,</u>
Item [*] Notice:, should read:
-- Subject to any disclaimer, the term of this
patent is extended or adjusted under 35 U.S.C.
154(b) by 0 days. --

Signed and Sealed this

Seventeenth Day of February, 2004

JON W. DUDAS
*Acting Director of the United States Patent and Trademark Office*